United States Patent
Holzmann et al.

(10) Patent No.: US 10,921,348 B2
(45) Date of Patent: Feb. 16, 2021

(54) MODULAR DEVICE ARCHITECTURE

(71) Applicant: Rohde & Schwarz GmbH & Co. KG, Munich (DE)

(72) Inventors: Gottfried Holzmann, Zorneding (DE); Heinrich Bichl, Munich (DE); Sven Gollon, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/053,427

(22) Filed: Aug. 2, 2018

(65) Prior Publication Data

US 2019/0041427 A1 Feb. 7, 2019

(30) Foreign Application Priority Data

Aug. 4, 2017 (EP) ..................................... 17184868

(51) Int. Cl.
*G01R 1/04* (2006.01)
*G01R 31/28* (2006.01)
*H01L 21/00* (2006.01)

(52) U.S. Cl.
CPC .............. *G01R 1/0416* (2013.01); *G01R 1/04* (2013.01); *G01R 31/2891* (2013.01)

(58) Field of Classification Search
CPC ........ H01L 21/00; H01L 2221/00; G01R 1/00
See application file for complete search history.

(56) References Cited

U.S. PATENT DOCUMENTS

| | | | |
|---|---|---|---|
| 5,010,450 A * | 4/1991 | Werdin | G06F 13/409 250/551 |
| 5,305,183 A | 4/1994 | Teynor | |
| 6,411,520 B1 * | 6/2002 | Hauke | H05K 7/1445 361/730 |
| 7,342,807 B2 | 3/2008 | Mueller et al. | |
| 8,847,371 B2 | 9/2014 | Otsuka et al. | |
| 9,577,770 B2 | 2/2017 | Oneil et al. | |
| 2002/0080811 A1 | 6/2002 | Wetzel et al. | |
| 2002/0119683 A1 * | 8/2002 | Paredes | H04L 12/5692 439/76.1 |
| 2002/0155616 A1 * | 10/2002 | Hiramatsu | B01L 3/545 436/165 |
| 2002/0181194 A1 | 12/2002 | Ho et al. | |
| 2003/0031003 A1 | 2/2003 | Sucharczuk et al. | |
| 2010/0049893 A1 * | 2/2010 | Drako | G06F 13/409 710/301 |
| 2012/0295663 A1 * | 11/2012 | Son | H04W 24/06 455/557 |
| 2015/0116186 A1 * | 4/2015 | Huang | H05K 1/18 343/906 |
| 2016/0234978 A1 | 8/2016 | Lam | |

(Continued)

FOREIGN PATENT DOCUMENTS

CN 1711812 A 12/2005
CN 201449577 U 5/2010
(Continued)

*Primary Examiner* — Jermele M Hollington
*Assistant Examiner* — Temilade S Rhodes-Vivour
(74) *Attorney, Agent, or Firm* — Christensen O'Connor Johnson Kindness PLLC

(57) ABSTRACT

A modular RF measuring device has a motherboard arranged centrally within the device so as to define a front side and a rear side, the front side and the rear side each comprising module interfaces.

13 Claims, 3 Drawing Sheets

(56) References Cited

U.S. PATENT DOCUMENTS

2016/0329974 A1* 11/2016 Oneil ..................... H04B 17/19
2017/0086332 A1* 3/2017 Jaskela ............. H05K 7/20718

FOREIGN PATENT DOCUMENTS

| CN | 103163995 A | 6/2013 |
| CN | 103247580 A | 8/2013 |
| DE | 10245119 A1 | 10/2003 |
| EP | 0464658 A2 | 1/1992 |
| EP | 1219965 A1 | 7/2002 |
| JP | 2013-190396 A | 9/2013 |

* cited by examiner

MODULAR DEVICE ARCHITECTURE

FIELD OF THE DISCLOSURE

Embodiments of the disclosure relate to a modular RF measuring device.

BACKGROUND

RF measuring devices are known in various configurations. One system is the so-called PXI system which is a modular electronic instrumentation platform using vertically arranged insertion slots for various modules to be inserted into the device.

Another system is the so-called AXI system which receives the different modules in horizontally arranged insertion slots.

There is a general desire to increase the flexibility of such modular RF measuring device.

SUMMARY

Embodiments of the disclosure provide a modular RF measuring device having a motherboard arranged centrally within the device so as to define a front side and a rear side, the front side and the rear side each comprising module interfaces. The disclosure is based on the concept of "dividing" the interior of the housing of the modular RF measuring device into a front and a rear side, namely by arranging the motherboard vertically within the housing. Accordingly, different PCBs or modules can be arranged on either side of the motherboard and connected thereto, resulting in a modular system which offers a great flexibility.

According to some embodiments, a plurality of insertion slots is provided for modules to be mounted horizontally within the measuring device both on the front side and the rear side of the motherboard. Horizontally arranged insertion slots allows using very wide PCBs on which more electronic components can be placed as compared to PCBs which have to be accommodated in vertically extending insertion slots. Looking at an example in which the measuring device is placed in a 19 inch rack, the PCBs placed in the insertion slots can have a width of almost 19 inch.

Within the insertion slots on the front side of the motherboard, at least two measuring modules can be arranged, for example. It is however also possible to provide for more insertion slots, for example three or four.

According to some embodiments, the measuring modules each have a recessed portion, with an RF connector being arranged at the edge of the recessed portion of each measuring module. These embodiments offer the advantage that the connection between individual measuring modules is made "within" the measuring device as the RF connectors can be placed with some distance to the virtual (meaning: rectangular) outer contour of the measuring modules.

As a result, RF cables used for connecting the RF connector of one of the measuring modules to the RF connector of another one of the measuring modules do not have to be arranged outside of the housing of the measuring device but can be placed within the housing where they are protected so that they cannot be damaged.

In some embodiments, a cover is provided for protecting the RF cables so as to prevent that a user unintentionally interferes with the RF cables.

According to some embodiments, the insertion slots of the measuring modules extend over the entire width of the measuring device. Thus, the measuring modules occupy the maximum available space within the measuring device.

According to some embodiments, at least two measuring modules with a width which is a fraction of the entire width of the insertion slot are received within one of the insertion slots on the front side of the motherboard. The measuring modules are connected to each other so as to form a unit having the width of the insertion slot. These embodiments increase the flexibility as it allows using one and the same insertion slot for measuring modules with different widths.

According to some embodiments, the insertion slots on the rear side of the motherboard are adapted for receiving at least one of a computer, a power supply and a baseband signal processor. The insertion slots on the rear side of the motherboard provide for a great flexibility when configuring the measuring device.

In some embodiments, at least one of the insertion slots on the rear side of the motherboard has a width which is ½ of the width of a full insertion slot. This even further increases the flexibility for choosing the configuration of the measuring device.

According to some embodiments, a cooling module is arranged within the device. In an embodiment, the cooling module comprises a fan or a blower. With the cooling module, the measuring device can be adapted in a very flexible manner to the amount of waste heat to be removed from a respective measuring module.

The cooling module can be arranged in a side wall of the device, thereby not interfering with the insertion slots.

In order to allow a quick exchange of cooling modules, the cooling modules can be received within an insertion slot provided in the device.

In some embodiments, a cooling air channel for supplying cooling air to a plurality of modules inserted on the front and/or rear side of the motherboard is provided. The cooling module is in flow connection with the cooling air channel. The cooling air channel distributes the cooling air to the various PCBs accommodated in the measuring device. The cooling air channel can be adapted for controlling which amount of cooling air is distributed to which PCB, thereby improving cooling efficiency.

The cooling air channel in some embodiments can extend vertically over all insertion slots on the respective side of the motherboard so that any position within the various insertion slots can be used for PCBs having an increased heat load.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
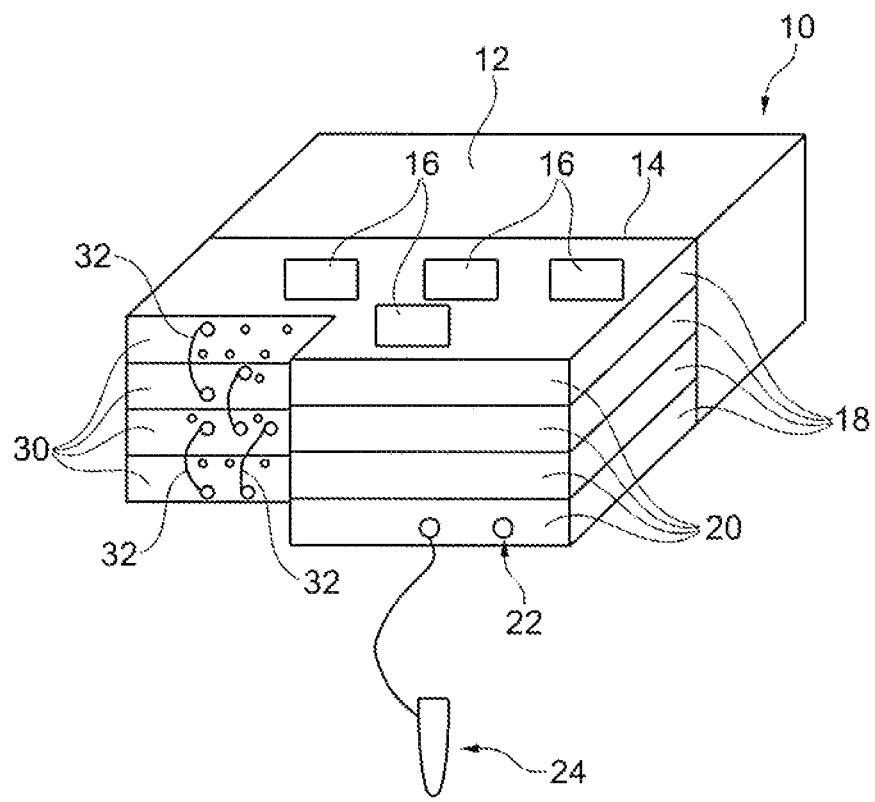
FIG. 1 is a perspective view of a measuring device according to a representative embodiment.
Figure 2:
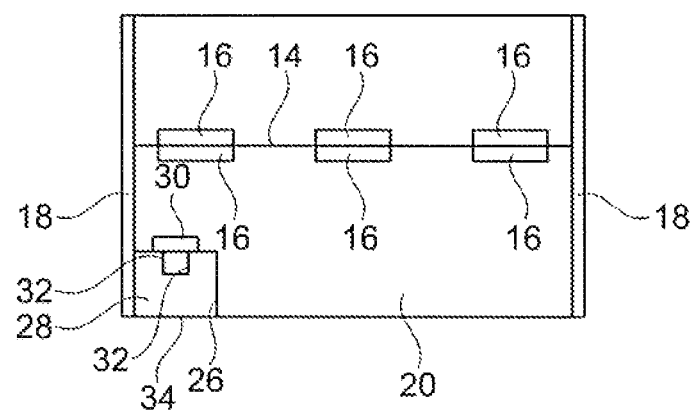
FIG. 2 is a top view of the measuring device of FIG. 1.
Figure 3:
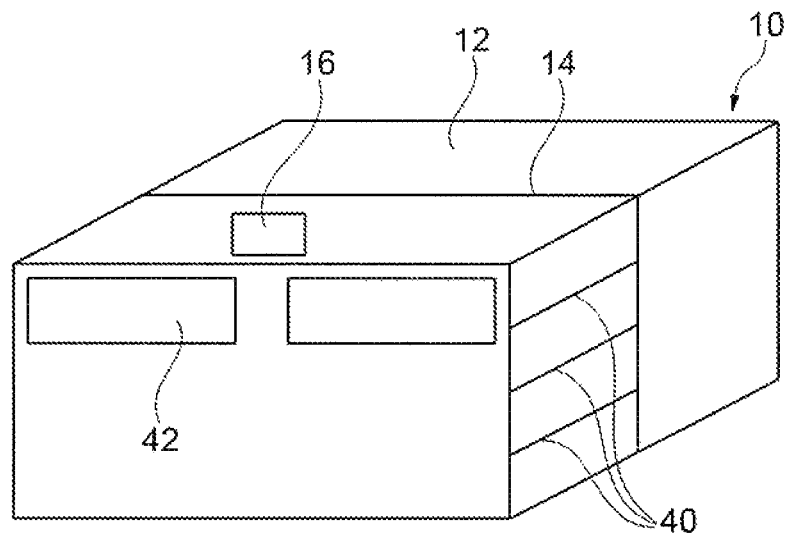
FIG. 3 is a perspective view of the measuring device of FIG. 1, shown from the opposite side.

In FIGS. 1, 2, and 3, a modular RF measuring device 10 is shown. It comprises a schematically shown housing 12 within which the various components of the measuring device are arranged. The housing 12 in turn can be arranged within for example a rack, for example a 19 inch rack.

Within housing 12, a motherboard 14 is centrally arranged. Because of the position of motherboard 14 within housing 12, the opposite sides of motherboard 14 can be referred to as being a front side and a rear side. Looking at FIG. 1, the front side is the one visible in this figure while the rear side is the opposite side. On the front side and the rear side of motherboard 14, a plurality of module interfaces 16 is provided. For better clarity, only some of the interfaces 16 are schematically shown in FIG. 1.

The housing 12 is provided with a plurality of insertion slots both on the front side and the rear side. On the front side (please see for example FIG. 1), the insertion slots 18 are provided for receiving measuring modules 20. As one example, measuring module 20 can have a measurement terminal 22, and a schematically shown DuT 24 (device under test) is connected to one of the measuring modules. In some embodiments, the insertion slots 18 extend over the entire width of housing 12.

As can be seen for example in FIG. 2, the measuring modules 20 (e.g., the PCB of the respective measuring modules 20) are provided with a cutout 26. In the embodiment shown, cutout 26 is rectangular. Thus, in a top view, there is a rectangular free space 28 formed by recessed portion 26. Of course, other configurations of the recessed portion 26 can be practiced with embodiments of the disclosure.

Close to recessed portion 26, each measuring module 20 is provided with an RF connector 30 which, for example, is arranged close to the edge of the PCB of measuring module 20 which extends in parallel with motherboard 14. RF connectors 30 receive RF cables 32 in order to provide for the desired connection between the individual measuring modules 20. RF cables 32 extend within the "free space" 28 formed by recessed portions 26. As can be seen in FIG. 1, the free space extends over the entire height of housing 12 so that all measuring modules 20 are accessible. A cover 34 is provided for preventing uncontrolled access to the space in which RF cables 32 are arranged.

On the rear side of motherboard 14, insertion slots 40 are provided which are adapted for receiving modules such as an industry computer, a power supply and/or a baseband signal processor. These modules are schematically shown with reference numeral 42 in FIG. 3. As can be seen in FIG. 3, insertion slots 40 in some embodiments have a width which is approximately half of the width of housing 12. Accordingly, two different modules can be arranged at each "level" within housing 12.

The combination of centrally arranged motherboard 14 with insertion slots 18, 40 on opposite sides of housing 12 provides for a great flexibility when selecting the individual modules for forming the desired modular RF measuring device. Each of the modules (e.g., the PCB of the respective module) comprises an interface plug connector adapted for engaging into module interfaces 16 arranged on motherboard 14. The connections between measuring modules 20 can be made in a flexible manner via RF cables. The RF cables are protected by cover 34 so that a user cannot unintentionally interfere with the cables.

Furthermore, measuring device 10 can be supplied preconfigured to a customer. This also allows the use of dedicated software which does not have to be configured by the customer (or is at least reasonably preconfigured so as to reduce the amount of effort necessary for the customer in order to finally have an operable measuring device).

Figure 4:
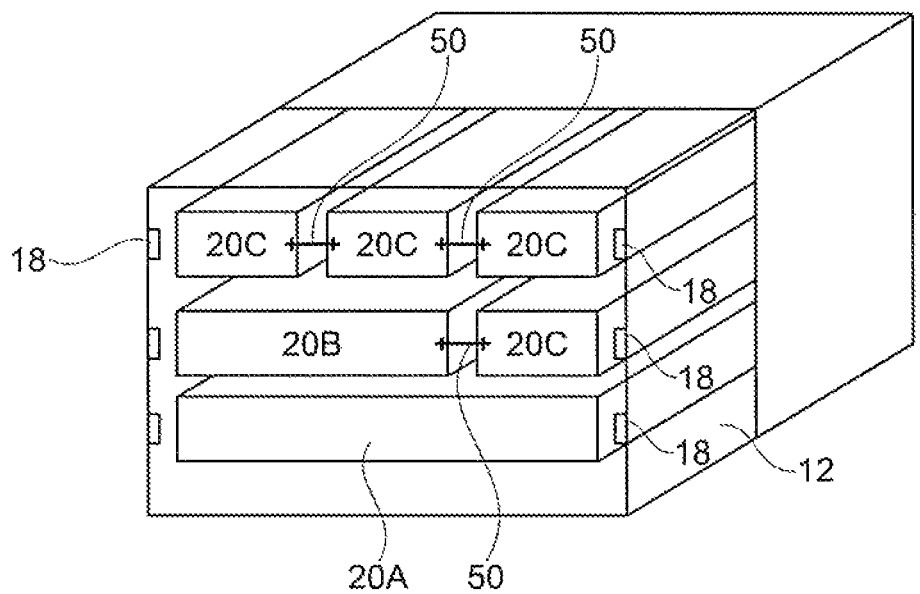
FIG. 4 is a schematic perspective view similar to FIG. 1, showing a measuring device according to another representative embodiment of the disclosure.

FIG. 4 shows different configurations of measuring modules 20 received within the insertion slots 18. Measuring module 20A shown in lowermost insertion slot 18 extends, for example, over the entire width of housing 12. In an intermediate insertion slot 18, two measuring modules 20B, 20C are shown, with measuring module 20B having a width of, for example, approximately ⅔ of the width of insertion slot 18 while measuring module 20C has a width which, for example, is approximately ⅓ of the width of insertion slot 18. Measuring modules 20B, 20C are connected to each other via connectors 50 or other connecting means so as to form a unit with a width corresponding to the width of insertion slot 18. In some embodiments, the connectors 50 can for example be formed by screws used for rigidly connecting measuring modules 20B, 20C to each other.

In the top insertion slot 18, three measuring modules 20C are arranged which, in a manner comparable to the connection between measuring modules 20B, 20C, are connected to each other with connectors 50. Here again, a unit composed of measuring modules 20C is formed which have, for example, a width which corresponds to the width of insertion slot 18.

Figure 5:
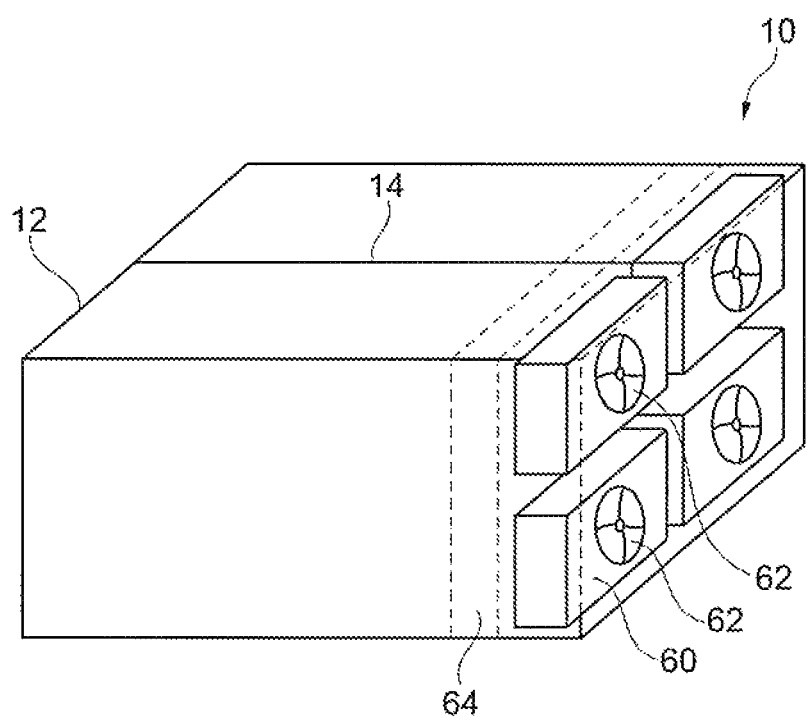
FIG. 5 is a perspective view of a measuring device according to yet another representative embodiment of the disclosure.

FIG. 5 schematically shows an embodiment in which cooling modules 60 are arranged within housing 12 of measuring device 10. In some embodiments, the cooling modules 60 each comprise a fan 62 with a corresponding motor (not shown). Blowers may also be used. Cooling modules 60 are arranged in a side wall of housing 12. Insertion slots can be provided for receiving cooling modules 60.

A cooling air channel 64 is provided within housing 12. It is in flow connection with cooling modules 60 and extends over the entire height of housing 12. The cooling air channel is used to distribute the cooling air provided by cooling modules 60 to the modules received within the respective insertion slots. To this end, cooling air channel 64 can be provided without flow openings which are used to guide the cooling air towards those portions of the module where the maximum of waste heat is being generated.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A modular RF measuring device, comprising:
   a motherboard arranged centrally within the device so as to define a front side and a rear side, the front side and the rear side each comprising module interfaces, at least two measuring modules being received within insertion slots on the front side of the motherboard and the measuring modules each having a recessed portion at a face opposite to the motherboard, with an RF connector being arranged at the edge of the recessed portion of each measuring module, wherein one or more RF cables are provided which connect the RF connector of one of the measuring modules to the RF connector of another one of the measuring modules.

2. The device of claim 1, wherein a plurality of insertion slots are provided for modules to be mounted horizontally within the measuring device both on the front side and the rear side of the motherboard.

3. The device of claim 1, wherein a cover for protecting the RF cable(s) is provided.

4. The device of claim 1, wherein the insertion slots for the measuring modules extend over the entire width of the measuring device.

5. The device of claim 4, wherein at least two measuring modules with a width which is a fraction of the entire width of the insertion slot are received within one of the insertion slots on the front side of the motherboard, the measuring modules being connected to each other so as to form a unit having the width of the insertion slot.

6. The device of claim 1, wherein the insertion slots on the rear side of the motherboard are adapted for receiving at least one of a computer, a power supply and a baseband signal processor.

7. The device of claim 6, wherein at least one of the insertion slots on the rear side of the motherboard has a width which is ½ of the width of a full insertion slot.

8. The device of claim 1, wherein a cooling module is arranged within the device.

9. The device of claim 8, wherein the cooling module is arranged in a side wall of the device.

10. The device of claim 8, wherein the cooling module is received within an insertion slot provided in the device.

11. The device of claim 8, further having a cooling air channel configured for supplying cooling air to a plurality of modules inserted on the front and/or rear side of the motherboard, the cooling module being in flow connection with the cooling air channel.

12. The device of claim 11, wherein the cooling air channel extends vertically over all insertion slots on the respective side of the motherboard.

13. The device of claim 8, wherein the cooling module comprises a fan.

* * * * *